(12) United States Patent
Ma et al.

(10) Patent No.: US 10,297,714 B1
(45) Date of Patent: May 21, 2019

(54) HETEROGENEOUS TUNNELING JUNCTIONS FOR HOLE INJECTION IN NITRIDE BASED LIGHT-EMITTING DEVICES

(71) Applicant: Wisconsin Alumni Research Foundation, Madison, WI (US)

(72) Inventors: Zhenqiang Ma, Middleton, WI (US); Dong Liu, Madison, WI (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 0 days.

(21) Appl. No.: 15/945,947

(22) Filed: Apr. 5, 2018

(51) Int. Cl.
| | |
|---|---|
| *H01L 29/06* | (2006.01) |
| *H01L 33/06* | (2010.01) |
| *H01L 33/26* | (2010.01) |
| *H01L 33/00* | (2010.01) |
| *H01L 33/16* | (2010.01) |
| *H01L 33/22* | (2010.01) |
| *H01L 33/14* | (2010.01) |
| *H01L 33/44* | (2010.01) |
| *H01L 33/40* | (2010.01) |

(52) U.S. Cl.
CPC ............ *H01L 33/06* (2013.01); *H01L 33/005* (2013.01); *H01L 33/0012* (2013.01); *H01L 33/14* (2013.01); *H01L 33/16* (2013.01); *H01L 33/22* (2013.01); *H01L 33/26* (2013.01); *H01L 33/44* (2013.01); *H01L 33/40* (2013.01); *H01L 2933/0016* (2013.01)

(58) Field of Classification Search
CPC ........... H01L 31/03048; H01L 33/0062; H01L 33/06; H01L 33/0075; H01L 33/0025; H01L 33/26; H01L 29/2003; H01S 5/34
See application file for complete search history.

(56) References Cited

U.S. PATENT DOCUMENTS

| | | | |
|---|---|---|---|
| 8,986,532 B2 | 3/2015 | Hamers et al. | |
| 9,425,351 B2 * | 8/2016 | Ma | ........................ H01L 33/06 |
| 9,708,716 B2 | 7/2017 | Hamers et al. | |
| 2016/0359300 A1 * | 12/2016 | El-Ghoroury | ........... H01L 33/06 |

(Continued)

FOREIGN PATENT DOCUMENTS

WO WO2016/160720 10/2016

OTHER PUBLICATIONS

Zhang et al., Design of p-type cladding layers for tunnel-injected UV-A light emitting, Applied Physics Letters, vol. 109, 2016, pp. 191105-1 to 191105-5.

(Continued)

*Primary Examiner* — Hsien Ming Lee
(74) *Attorney, Agent, or Firm* — Bell & Manninng, LLC

(57) ABSTRACT

Light-emitting devices having a multiple quantum well (MQW) pin diode structure and methods of making and using the devices are provided. The light-emitting devices include: a tunneling heterojunction as a hole injector; an n-type contact; and a light-emitting active region disposed between the tunneling heterojunction and the n-type contact. The tunneling heterojunction facilitates interband tunneling hole injection under bias, whereby electrons in the valence band of a p-type group III-nitride semiconductor tunnel directly into the conduction band of the n-type doped semiconductor, resulting in the generation of holes in the p-type group III-nitride.

17 Claims, 11 Drawing Sheets

(56) References Cited

U.S. PATENT DOCUMENTS

2018/0277715 A1    9/2018  Ma et al.

OTHER PUBLICATIONS

Zhang et al., Interband tunneling for hole injection in III-nitride ultraviolet emitters, Applied Physics Letters, vol. 16, 2015, pp. 141103-1 to 141103-5.
Krishnamoorthy et al., Polarization-engineered GaN/InGaN/GaN tunnel diodes, Applied Physics Letters, vol. 97, 2010, pp. 203502-1 to 203502-3.
Liu et al., 229 nm UV LEDs using p-type silicon for increased hole injection, arXiv, Aug. 13, 2017, pp. 12 pages.

\* cited by examiner

HETEROGENEOUS TUNNELING JUNCTIONS FOR HOLE INJECTION IN NITRIDE BASED LIGHT-EMITTING DEVICES

REFERENCE TO GOVERNMENT RIGHTS

This invention was made with government support under HR0011-15-2-0002 awarded by the DOD/DARPA. The government has certain rights in the invention.

BACKGROUND

Blue light-emitting diodes (LEDs) are key to modern, energy-saving, environmentally friendly lighting, and have allowed the development of a range of cutting-edge applications, such as power-efficient screens, lasers for Blu-ray recorders, and laser printers. The cost-per-lumen of LEDs has rapidly decreased in the past decade. However, in the endeavor to further improve their light emission efficacy and power output, researchers have encountered an elusive issue of "efficiency droop"; i.e., efficiency decreases with increasing injection current density, which severely hinders the cost-per-lumen reduction. Non-radiative Auger recombination processes and electron overflow have been identified as the dominant origins of efficiency droop. Both Auger recombination and electron leakage are closely related to the carrier distribution within quantum wells (QWs), as the Auger recombination rate is dependent on the $n^2p$ ($n \gg p$, which is the case in a blue LED, where n and p are the electron and hole concentrations, respectively), and electron overflow ensues as a result of carrier imbalance and insufficient recombination within the QWs.

When this issue was traced back to the material growth method and device epilayer design, two factors were found to be primarily responsible for the ineffective carrier confinement and insufficient hole concentration in the QWs. One is the strong polarization-induced internal electric field intrinsic to III-nitride semiconductors along the c-direction due to their wurtzite crystal structure. The associated electron-hole wavefunction spatial mismatch within the QWs could result in the decreased radiative recombination rate. The other is poor hole injection into the active region due to the Mg doping challenge, and low hole mobility in p-GaN and the AlGaN electron blocking layer (EBL). Thus, to mitigate the drooping effect, there are two main routes researchers have taken: polarization effect suppression within the QWs; and hole injection enhancement to the active region. Regarding the polarization field engineering, approaches adopted include semi- or n-polar GaN and quantum barriers/wells structure combination manipulations. However, the growth of these semi- or n-polar plane wafers, and the fabrication processes that follow, bring about substantial complication compared to the conventional c-plane LED structures. Regarding the hole injection issue, approaches proposed include doping and thickness engineering in the QWs, insertion of a hole reservoir, and the design of the EBL. Although those approaches have demonstrated alleviated droop effect by percentage, the doping limitation of p-GaN or p-AlGaN still poses a fundamental hurdle to high efficacy achievement. There have been reports on the uses of an n+/p+ GaN homojunction or a p+ GaN/InGaN/n+-GaN polarization junction as the hole tunneling supplier layer. These junctions provided increased carrier injection efficiency and resultant enhanced optical performances. However, this approach complicates the crystalline material growth process, due to the large variation in the indium content, and demands critical doping control for the heavily doped p+ and n+ GaN layers.

SUMMARY

Light-emitting devices having a multiple quantum well pin diode structure and methods of making and using the devices are provided. The light-emitting devices include: a tunneling heterojunction as a hole injector; an n-type contact; and a light-emitting active region disposed between the tunneling heterojunction and the n-type contact.

One embodiment of light-emitting device includes a heterojunction that includes: a hole injection layer comprising a single-crystalline or polycrystalline n-type doped semiconductor material, wherein the single-crystalline or polycrystalline n-type doped semiconductor material is not a group III-nitride semiconductor material; and a p-type layer comprising a p-type doped group III-nitride. The device further includes an n-type contact and an active region comprising intrinsic semiconductor materials disposed between the p-type layer of the heterojunction and the n-type contact. The active region includes a multiple quantum well structure comprising alternating group III-V nitride barrier layers and group III-V nitride quantum well layers.

Some embodiments of the light-emitting devices further include a quantum tunnel layer disposed between the hole injection layer and the p-type layer, the quantum tunnel layer comprising an inorganic material having a bandgap that is wider than the bandgaps of the n-type doped semiconductor material and the p-type doped group III-nitride.

In some embodiments of the light-emitting devices, the p-type group III-nitride is p-type GaN and in some embodiments of the light-emitting devices, the n-type doped semiconductor material comprises an n-type doped group IV semiconductor, such as n-type doped silicon.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1B:
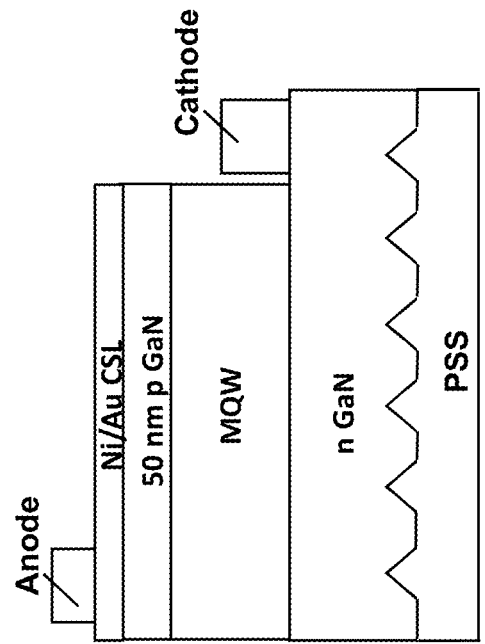
FIG. 1B is a schematic diagram of a conventional LED structure.

Light-emitting devices having a multiple quantum well (MQW) pin diode structure and methods of making and using the devices are provided. The light-emitting devices include: a tunneling heterojunction as a hole injector; an n-type contact; and a light-emitting active region disposed between the tunneling heterojunction and the n-type contact.

The tunneling heterojunction of the light emitting device is composed of a hole injection layer comprising a heavily n-type doped non-group III-nitride semiconductor and a p-type layer comprising a heavily p-type doped group III-nitride semiconductor, such as p-type doped GaN (p-GaN). The tunneling heterojunction can be fabricated using a thin film transfer and bonding process that allows the material of the n-type hole injection layer to be selected independently from the group III-nitride material of the p-type layer and also from the intrinsic semiconductor materials of the device's active region.

The tunneling heterojunction facilitates interband tunneling hole injection under bias, whereby electrons in the valence band of the p-type group III-nitride semiconductor tunnel directly into the conduction band of the n-type doped semiconductor, resulting in the generation of holes in the p-type group III-nitride, which are injected into the active MQW region of the device. Relative to light-emitting devices that do not include the tunneling heterojunctions, but that otherwise have a comparable structure, the present light-emitting devices can provide higher hole injection efficiencies and, therefore, improved device performance.

Optionally, the n-type doped non-group III-nitride semiconductor and the p-type doped group III-nitride semiconductor are separated by a quantum tunnel layer. If present, the quantum tunnel layer is formed of an inorganic material having a bandgap that is wider that the bandgaps of the hole injection layer material and the p-type layer group III-nitride material. As used herein, the quantum tunnel layer is characterized in that it is made from an appropriate material and is sufficiently thin that it is able to act as a tunneling layer for electrons and/or holes. That is, unlike a typical dielectric medium, it allows both electrons and holes to pass through it, from a first layer to a second layer of semiconductor material, via quantum tunneling. Thus, because metals would block the passage of holes, metals are not suitable materials for a quantum tunnel layer. However, a wide range of non-metal inorganic materials can meet these criteria. The inorganic material of the quantum tunnel layer may be a material that would act as a dielectric in its bulk form but is sufficiently thin that it no longer acts as an electrical insulator. The inorganic layer also provides a sort of 'glue' between the layers of the tunneling heterojunction. In addition, the inorganic layer can prevent the interdiffusion of the semiconductor materials from the neighboring layers of tunneling heterojunction. This avoids the formation of an unwanted, intervening, cross-contaminated semiconductor interface layer.

Another advantage provided by an intervening layer of inorganic material is that it can passivate the surfaces of the layers of semiconductor materials with which it is in contact, such that dangling bonds and interface states are minimized or eliminated. This property is useful because, when directly bonding two non-lattice matched single-crystalline materials, the chemical bonds formed between the two materials can create a large number of interface states. These interface states prevent the two materials from forming ideal rectifying junctions. However, when the inorganic material is inserted, the two materials are physically separated. If the layer is sufficiently thin and has the capability to chemically passivate the materials, the number of interface states can be reduced to levels such that both electrons and holes can efficiently tunnel through the layer.

The intrinsic active region includes a MQW structure comprising alternating barrier and quantum well layers, both of which are comprised of group III-V nitride semiconductors. In the MQW structures, charge carriers are confined via quantum confinement in thin layers of the "well" material sandwiched between layers of the "barrier" material. The active region may further comprise a lower spacer layer and an upper spacer layer between which the MQW structure is disposed. For active regions designed to emit in the ultraviolet and the deep ultraviolet, the well layers can comprise a high aluminum content AlGaN. For example, $Al_xGa_{1-x}N$, where x is at least 0.5 or at least 0.8 can be used.

Other components that may be part of the light-emitting devices are those commonly incorporated into such devices, including a substrate, buffer layers, cladding layers, reflectors, electrodes, and electrical interconnects. For example, the devices may further comprise electrodes in electrical communication with the tunneling heterojunction and n-type contact and a voltage source configured to apply a voltage across the active region of the device.

LEDs are examples of light-emitting devices that can include the MQW pin diode structures. A schematic diagram showing a cross-sectional view of one embodiment of an LED is provided in FIG. 1A. The LED includes a substrate (a patterned sapphire substrate (PSS) in this example) and an n-type contact comprising an electron injection layer comprising an n-type doped semiconductor material (n-GaN in this example). If the substrate is a growth substrate upon which the electron injection layer is epitaxially grown, the structure may further include a buffer layer to facilitate the epitaxial growth of the semiconductor material of the electron injection layer over the substrate material. An active region comprising a MQW structure that includes alternating barrier layers and well layers is disposed on the electron injection layer. A tunneling heterojunction structure is disposed on the MQW structure and includes a quantum tunnel layer ($Al_2O_3$ in this example) disposed between a p-type layer (p-GaN in this example) and a hole injection layer (n-Si in this example). Though not shown in this figure, the LED may further include a current spreading layer on the hole injection layer.

Lasers are also examples of light-emitting devices that can include the MQW pin diode structures. For example, the MQW pin diode structures can also be incorporated into an edge-emitting laser. The edge-emitting laser includes a substrate and an n-type contact comprising an electron injection layer composed of an n-type doped semiconductor material. A lower cladding is disposed on the electron injection layer. An active region comprising a MQW structure is disposed on the lower cladding layer and an upper cladding layer is disposed over the MQW active region. In this embodiment of a light-emitting device, the tunneling heterojunction is disposed on the upper cladding layer. An anode and a cathode are placed in electrical communication with the hole and electron injection layers, respectively.

Figure 2:
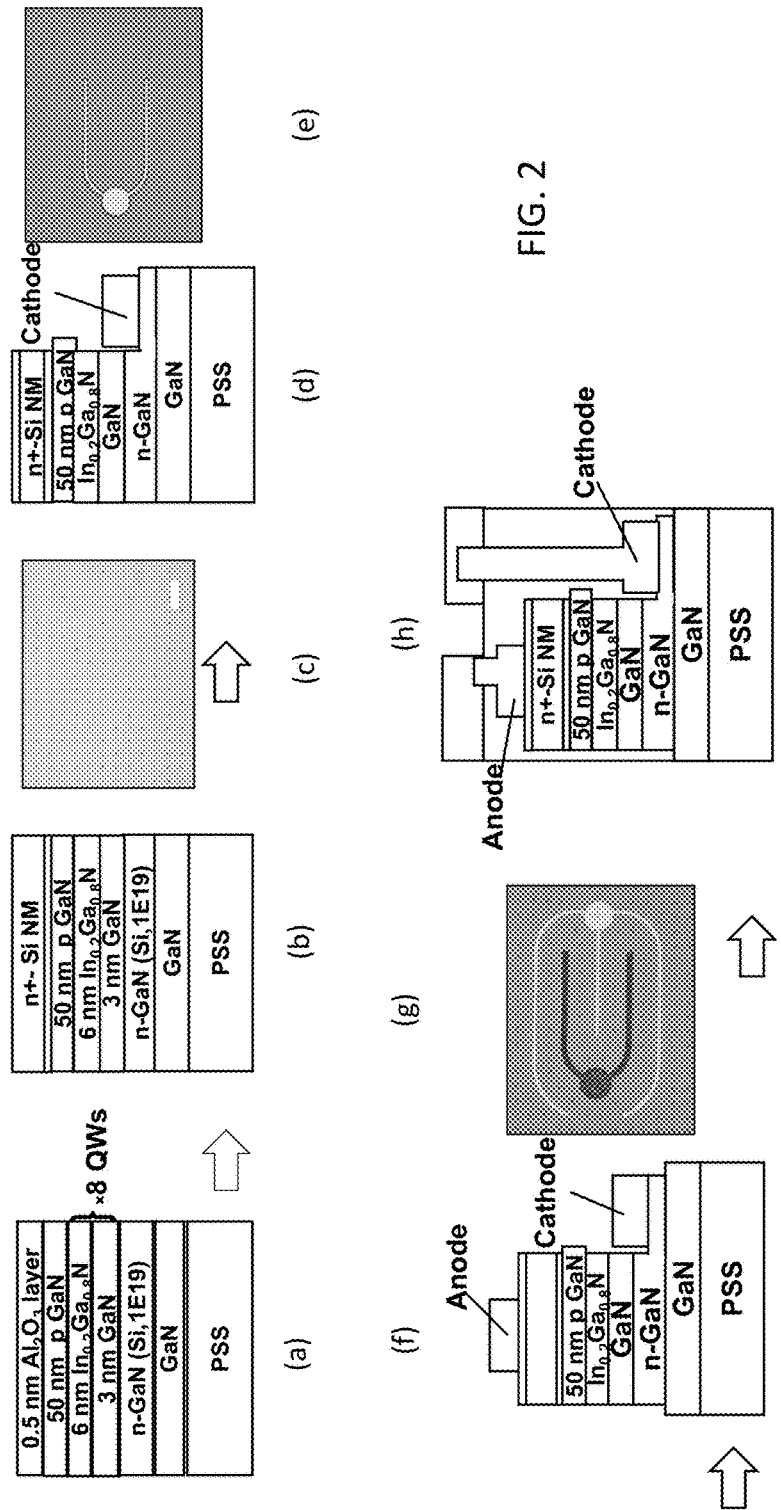
FIG. 2 shows the fabrication process flow for an LED with an Si NM hole injector. Panel (a) is a schematic of the InGaN/GaN wafer with 0.5 nm $Al_2O_3$ deposition by ALD. Panel (b) is a cross-sectional view of the structure after Si NM transfer, followed by annealing. Panel (c) is a microscope image of the post-transfer wafer surface. Panel (d) is a cross-sectional view. Panel (e) is a microscope image of the device after cathode mesa etching and ohmic metal contact formation. Panel (f) is a cross-sectional view. Panel (g) is a microscope image after anode metal deposition and isolation. Panel (h) is the final structure with $SiO_2$ planarization and metal interconnection.

One embodiment of a method for forming a light emitting device is shown schematically in FIG. 2. Panel (a) in FIG. 2 shows a heterostructure that includes a substrate (PSS), a buffer layer (GaN), an n-type doped electron injection layer (n-GaN), a MQW active region (8 bilayers of 3 nm/6 nm GaN/InGaN), and a p-type layer (p-GaN). This heterostructure can be fabricated using existing epitaxial growth techniques, such as molecular beam epitaxy (MBE). Upon the upper surface of the p-type layer, a quantum tunnel layer ($Al_2O_3$) is deposited (panel (a)). The quantum tunnel layer can be deposited using, for example, atomic layer deposition (ALD). The thickness of the quantum tunnel layer typically need only be on the order of the root mean square (rms) roughness of the surfaces of the layers of semiconductor material which it binds. By way of illustration, in some embodiments, the quantum tunnel layer has a thickness in the range from about 0.5 to about 10 nm. This includes embodiments in which it has a thickness in the range from about 0.5 to about 5 nm or from about 0.5 to about 3 nm. Since the thickness of the quantum tunnel layer may not be uniform on an atomic scale, the thickness of the layer corresponds to the average thickness of the layer across the bonding interfaces of the heterostructure.

Once the quantum tunnel layer is formed, a thin layer of pre-formed, single-crystalline, n-type doped semiconductor material (referred to as a semiconductor nanomembrane (NM), in this example it is a Si NM) can be placed on its upper surface to provide the hole injection layer, as shown in panel (b) of FIG. 2. This can be achieved using a NM transfer and bonding process, as illustrated in the Examples. The bonding between the transferred layer of single-crystalline n-type doped semiconductor material and the quantum tunnel layer can be enhanced by annealing. Next, a cathode mesa is etched through the heterostructure down to the n-type doped electron injection layer (panel (d)) and a cathode is deposited using, for example, metallization (panel (d)). An anode is then deposited on the single-crystalline n-type doped semiconductor material using, for example, metallization (panel (f)).

The method of transferring a pre-formed single-crystalline n-type doped semiconductor layer onto the quantum tunnel layer (or, if the quantum tunnel layer is absent, onto the p-type group III-nitride) can be carried out starting with a semiconductor-on-insulator substrate comprised of a handle wafer, such as a Si handle wafer, a buried oxide layer, and a thin layer of the n-type doped single-crystalline semiconductor, such as a thin layer of single-crystalline n-type Si, n-type Ge, or n-type SiGe. Buried oxide layer is selectively removed from the structure. This can be carried out, for example, by forming an array of holes (apertures) through the thin layer of single-crystalline semiconductor and then selectively chemically etching away the buried oxide layer that is exposed through the apertures. These apertures may be regularly spaced, or randomly spaced. As a result, the thin layer of single-crystalline semiconductor settles onto the underlying handle wafer. A host material, such as a rubber stamp, is then pressed onto the upper surface of the released layer of the single-crystalline semiconductor, which adheres to the host material and is lifted away from the handle wafer. In a subsequent step the released layer of single-crystalline semiconductor is brought into contact with, and transferred onto, the quantum tunnel layer or the p-type doped group III-nitride layer. The single-crystalline layer can be doped before or after transfer and bonding. The host material is then removed. A more detailed description of this type of transfer and bonding process can be found in U.S. patent publication number 2016/0204306.

An alternative method of transferring a single-crystalline n-type doped semiconductor layer onto a quantum tunnel layer of a p-type layer uses wafer bonding followed by hydrogen implantation to create a splitting plane in the semiconductor material—a technique that is sometimes referred to as Smart Cut. A description of the Smart Cut process can be found in Bruel et al., *Proceedings* 1995 *IEEE International SOI Conference,* 178 (1995). In this technique, a buried hydrogen implantation layer is formed in an n-type doped semiconductor substrate, such as a semiconductor wafer. The depth of hydrogen implantation layer will determine the thickness of the single-crystalline n-type doped semiconductor layer to be transferred. Once the splitting plane is formed via hydrogen implantation, the surface of substrate is contacted with the quantum tunnel layer or the p-type Group III-nitride layer on the previously grown heterostructure. The substrate is then split at the hydrogen implantation layer and the bulk of the substrate is removed. Optionally, the single-crystalline n-type doped semiconductor layer may be thinned using a post-transfer chemical mechanical polish.

As an alternative to single-crystalline silicon, polycrystalline silicon can be used as a hole injection layer. A thin film of polycrystalline silicon can be deposited on the quantum tunnel layer using, for example, low pressure chemical vapor deposition (LPCVD).

Neighboring layers of the heterojunctions that are fabricated using transfer and bonding processes or LPCVD do not have an epitaxial structure. As used herein the term "epitaxial structure" refers to a structure in which the crystallographic orientation of an overlying layer is determined by (matches) that of its underlying layer, such that the two layers have the same crystallographic orientation, at least in the area of their interface. Such epitaxial structures may include strains and stresses at the interface, induced by a lattice mismatch between the two materials and may even include misfit dislocations. In contrast to such epitaxial structures, non-epitaxial layers in the present heterojunctions have crystallographic orientations that are independent from (e.g., different from) those of their neighboring layers. As such, the layers that do not have an epitaxial structure are free of lattice mismatch-induced strains or stresses and lattice mismatch-induced misfit dislocations. In fact, the semiconductor materials selected for the n-type doped hole injection layer and the p-type layer of the tunneling heterojunctions can have a lattice constant mismatch that would render them unsuitable for epitaxial growth—even in the presence of an intermediate buffer layer.

In some embodiments, the inorganic material of the quantum tunnel layer is an oxide. In such embodiments, the oxide can comprise, consist of, or consist essentially of, a metal oxide, an oxide of a semiconductor element or an oxide of a metalloid element. Examples of oxides that may be used in metal oxide quantum tunnel layers include, but are not limited to, those that can be deposited via atomic layer deposition (ALD). Examples of such metal oxides include aluminum oxide ($Al_2O_3$), titanium oxide ($TiO_2$), hafnium oxide ($HfO_2$), tantalum oxide ($Ta_2O_5$), and silicon dioxide ($SiO_2$). In some embodiments, the metal, semiconductor or metalloid elements present in the oxide are different from any metal, semiconductor or metalloid elements in the other semiconductor layers with which they are in contact and between which they are disposed. In the tunneling heterojunctions, the inorganic oxide of the quantum tunnel layer is not a native oxide of the single-crystalline n-type semiconductor material of the hole injection layer; nor is it a native oxide of the p-type semiconductor (e.g., p-GaN) of the p-type layer. (As used herein, the term native oxide refers to an oxide that would be monolithically formed on the semiconductor material as the result of the oxidation of the material in an oxygen-containing environment. For example, Sift is a native oxide of Si.)

In other embodiments, the inorganic material of the quantum tunnel layer is a nitride. In such embodiments, the nitride can comprise, consist of, or consist essentially of, a metal nitride, a nitride of a semiconductor element or a nitride of a metalloid element. Examples of nitrides that may be used in nitride quantum tunnel layers include, but are not limited to, those that can be deposited via atomic layer deposition (ALD). Examples of such nitrides include aluminum nitride, silicon nitride, and titanium nitride. In some embodiments, the metal, semiconductor or metalloid elements present in the nitride are different from any metal, semiconductor or metalloid elements in the semiconductor layers with which they are in contact and between which they are disposed.

In some embodiments, the quantum tunnel layer comprises two or more sub-layers, each of which comprises an inorganic material, provided, however, that the total combined thickness of the sub-layers is still low enough to allow for the tunneling of electrons and holes through the layer. For example, in a quantum tunnel layer comprising multiple sub-layers of inorganic oxides, the inorganic oxides can be selected such that one oxide passivates one of the two neighboring semiconductor materials, while another oxide passivates the other of the two neighboring semiconductor materials.

Because the hole injection layer is not grown epitaxially from the p-GaN layer, the hole injection layer need not be a group III-V semiconductor. Thus, the single-crystalline or polycrystalline semiconductor material used for the hole injection layer can be independently selected from a broad range of n-doped semiconductors, including n-doped group IV semiconductors and n-doped group II-VI semiconductors. The group IV semiconductors include elemental semiconductors (e.g., Si, Ge and C, including diamond), as well as alloy and compound semiconductors (e.g., SiGe:C, SiGe, SiGeSn and SiC).

The semiconductor material of the hole injection layer is heavily doped. Generally, a degenerate doping level is desired, such that the material acts more like a metal than a semiconductor. By way of illustration, the semiconductor of the hole injection layer can have an n-type dopant concentration of at least $1 \times 10^{19}$ cm$^{-3}$.

The semiconductor material of the p-type layer is composed of p-doped group III-nitride semiconductor, such as Mg-doped GaN, or another p-doped group III-V nitride, which provides an electrically conductive path. Like the semiconductor material of the hole injection layer, the semiconductor material of the p-type layer is heavily doped and may be degenerately doped. Although, the dopant concentration of the p-type layer may be lower than the dopant concentration of the hole injection layer. By way of illustration, the semiconductor of the p-type layer can have a dopant concentration of at least $1 \times 10^{19}$ cm$^{-3}$.

The layers of semiconductor material that make up the active region (e.g., the well and barrier layers of the MQW structure and any spacer layers), the n-type doped semiconductor material of the electron injection layer, and, optionally any buffer layers, and/or substrate can be comprised of group III-V semiconductors. The group III-V semiconductors include binary, ternary and higher order compound semiconductors. Examples of group III-V semiconductors include GaN, AlN, InN, AlGaN, InGaN and InAlN.

The thicknesses of the layers of semiconductor materials that make up the devices will depend on the intended light-emitting device application. However, by way of illustration, in some embodiments of the devices, some or all of the layers of single-crystalline material have thicknesses of no greater than about 1000 nm. If the semiconductor materials of the charge injection layers and/or the doped contact layers absorb radiation within the emission wavelength range of the active region, it is advantageous to limit the thickness of these materials. For example, these doped semiconductor layers may have a thickness of 100 nm or less, including thicknesses of 50 nm or less, 20 nm or less, and 10 nm or less.

The wavelengths of the radiation emitted by the light-emitting devices will depend on the semiconductor materials used in the active region. For example, with the proper selection of materials, the light-emitting devices can be configured to emit in the ultraviolet (UV; wavelengths from ~100 to 400 nm, including the deep ultraviolet (DUV) with wavelengths below 250 nm, e.g., in the range from 220 to 240 nm) and/or in the visible (vis; wavelengths from 400 to 780 nm, including blue light with wavelengths in the range from 430 to 470) regions of the electromagnetic spectrum. By way of illustration, a light-emitting device designed to emit light in the wavelength range from about 220 to 240 nm could employ an active region having an MQW structure comprising alternating layers of single-crystalline, high aluminum-content, AlGaN quantum well layers and single-crystalline AlN barrier layers. This active region can be grown epitaxially over an n-type AlGaN electron injection layer. A light-emitting device designed to emit blue light could employ an active region having an MQW structure comprising alternating layers of single-crystalline InGaN quantum well layers and single-crystalline GaN barrier layers. This active region can be grown epitaxially over an n-type GaN electron injection layer.

EXAMPLES

Example 1

In this example, enhanced hole injection enabled by employing heavily n-doped Si NM as the hole injector layer in an Si/GaN tunneling heterojunction, and light emission efficiency improvements are demonstrated. LED structures incorporating the n-Si NM hole injectors were fabricated and characterized, both electrically and optically, and compared to a reference device with a conventional structure. It was found that, compared to the reference LED device, in terms of optical performances, the light output power and external-quantum efficiency (EQE) under the same electrical injection current (50 mA/cm$^2$) were improved by 52% for the LED structures with the n-Si/GaN tunneling heterojunctions. The band alignments of the LED structures and simulations of the hole densities within the QWs and the correlated electron leakage current are provided to demonstrate the higher hole injection efficiency.

Experiments and Results

Figure 1A:
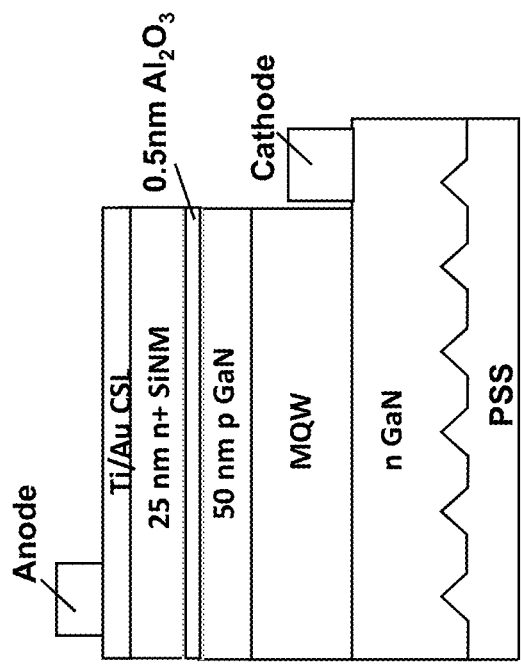
FIG. 1A is a schematic diagram of an LED with an n+Si/GaN hole injection tunneling junction.

Schematics of an improved LED structure and a reference InGaN/GaN based LED device, are shown in FIGS. 1A and 1B, respectively. The InGaN/GaN LED epi-wafers were grown on the (0001)-plane patterned sapphire substrates (PSS) by metal organic chemical vapor deposition (MOCVD). A GaN buffer layer was grown first. Then a 600 nm Si-doped GaN n-type contact layer was grown with a doping concentration of $1 \times 10^{19}$ cm$^{-3}$. This was followed by the growth of an eight-period In$_{0.2}$Ga$_{0.8}$N/GaN MQW active region with a quantum well/barrier thickness of 3 nm/6 nm. Lastly, a 50 nm Mg-doped GaN layer p-type layer was grown with a doping concentration of $5 \times 10^{19}$ cm$^{-3}$. The epi-wafers were treated with wet chemical cleaning steps using RCA cleaning. For the structure with a Si NM hole injection layer on top, a 0.5 nm-thick Al$_2$O$_3$ layer was deposited on the GaN-based LED epitaxial structure before Si NM transfer. A schematic cross-sectional view of the resulting structure is shown in FIG. 2, panel (a).

Figure 1C:
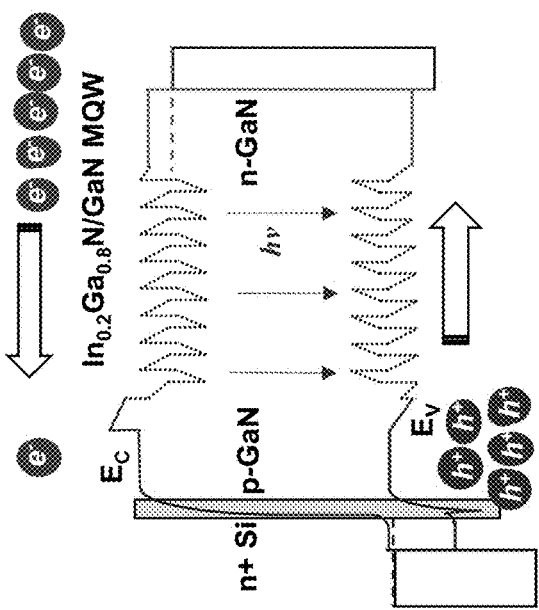
FIG. 1C shows the band structure of the LED in FIG. 1A.
Figure 1D:
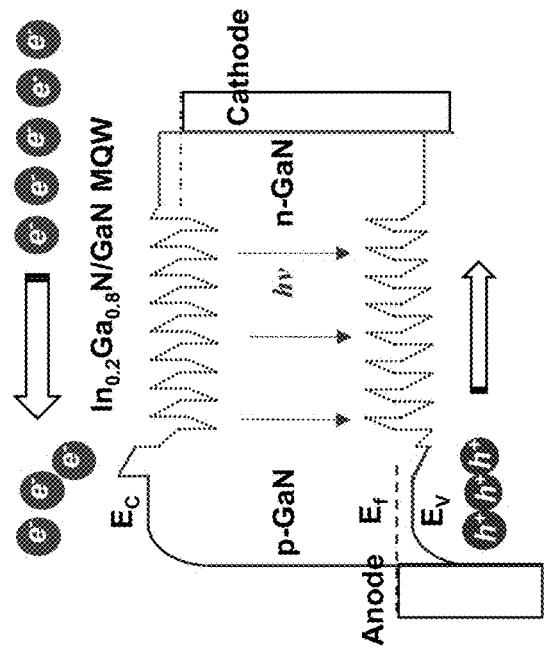
FIG. 1D shows the band structure of the LED in FIG. 1B. The electron and hole currents across the quantum wells are denoted by the arrows. The tunneling heterojunction formed between Si and GaN is shaded.

The associated band alignments of the two LED structures under forward bias are illustrated in FIGS. 1C and 1D, respectively. For the reference LED, the electrons and holes were injected into the active MQW region from the n-GaN and p-GaN layers. Because there were fewer free holes in the p-GaN than electrons in the n-GaN, the injection rates into the QWs were imbalanced, leading to electron overflow across the LED to the p side and undesirable non-radiative recombination within the active region. For the LED with the n+-Si/p-GaN tunneling heterojunction, interband tunneling hole injection occurred at the interface. FIG. 1C shows that the valence band of the p-GaN layer was shifted upwards to be aligned with the conduction band of the n+Si layer. A quasi-triangular shaped depletion region, 2~4 nanometers in width, was found, which was dependent on the doping concentration of the p-GaN layer (doping concentration of Si>>GaN) and the applied bias. Thus, direct tunneling occurred with the electrons in the valence band of the p-GaN tunneling into the conduction band of the n+-Si through the band energy gap. Because a large number of electrons flowed away from the p-GaN, holes, which are electron vacancies, were generated in the same quantity within the p-GaN region and were eventually injected into the QWs region. The higher the hole tunneling probability is, the more holes that were produced, and the higher hole density is within the MQW active region.

The fabrication process of the LED is depicted in FIG. 2. The Si NM preparation started with a silicon-on-insulator (500 (Si/buried oxide (box)=205 nm/400 nm) wafer, the top Si surface of which had been oxidized by dry oxidation until only a 25 nm-thick Si layer remained. Ion implantation followed to achieve a doping concentration in the n-Si layer of $9.0 \times 10^{19}$ cm$^{-3}$. The thinned Si NM was patterned via photolithography and subsequently released and transfer printed onto an Al$_2$O$_3$ layer that had been deposited onto the p-GaN of the epitaxial LED stack via ALD. The transfer of the n-Si NM was carried out using a PDMS elastomeric stamp. The ALD was implemented using an Ultratech/Cambridge Nanotech Savannah S200 ALD system integrated with a nitrogen-filled glove box. The post-transferred Si NM and device were annealed at 600° C. to increase their bonding strength. A schematic showing a cross-sectional view of the device, and a microscope image of the post-Si NM transfer surface, are shown in FIG. 2, panels (b) and (c), respectively. A cathode mesa was patterned by photolithography and etched down to the n-GaN layer using inductively coupled plasma (ICP). Then, a cathode electrode was patterned within the mesa area and Ti/Al/Ti/Au (10/100/10/200 nm) was deposited as the cathode metal using e-beam evaporation, as shown in FIG. 2, panel (d), and in the microscope image in FIG. 2, panel (e). Ni/Au (5 nm/5 nm) current spreading layers were deposited on the top Si NM of the improved LED and the p-GaN contact layer of the reference LED. An anode electrode was then patterned and deposited with Ni/Au (10/300 nm) as the anode metal shown as in FIG. 2, panels (f) and (g). Both cathode and anode electrodes were annealed at 600° C. for 30 s, and then the LEDs were isolated using the ICP process. The LED fabrication by finished with an interconnection process that included the plasma-enhanced chemical vapor deposition (PECVD) of a 600 nm SiO$_2$ layer, followed by the deposition of Ti/Al/Ti/Au (20/1000/20/200 nm) interconnection electrodes, as shown in FIG. 2, panel (h).

Figure 3A:
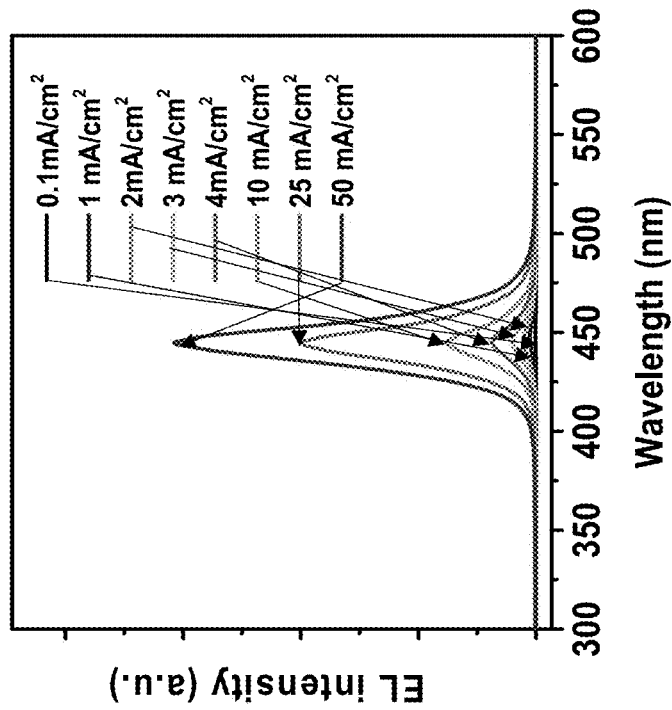
FIG. 3A shows the measured electroluminescence (EL) spectra for the reference LED with current densities ranging from 0.1 to 50 A/cm$^2$.
Figure 3B:
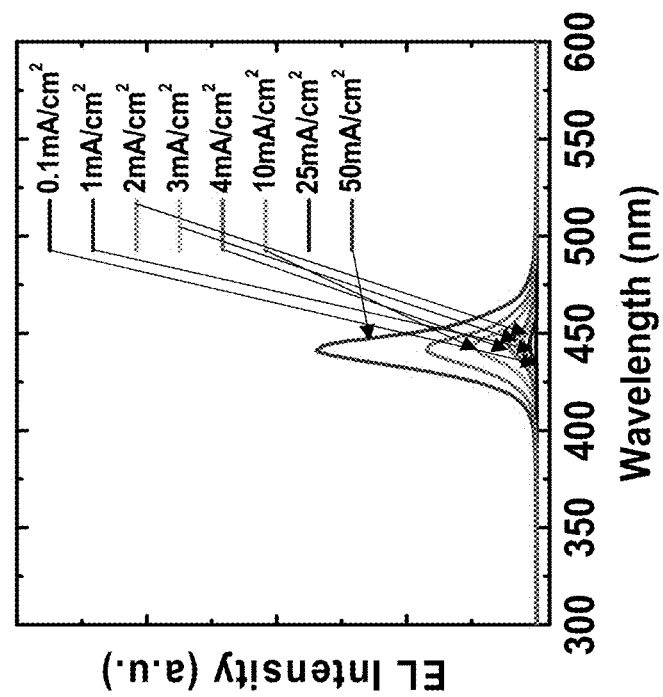
FIG. 3B shows the measured EL for the LED with an n+Si/GaN junction with current densities ranging from 0.1 to 50 A/cm$^2$.

The electroluminescence (EL) spectra measured for the reference LED and the improved LED with the n+Si/GaN tunneling heterojunction are shown in FIGS. 3A and 3B, respectively. The corresponding microscope images of the devices are included in the insets of each figure. To carry out optical measurements, the LEDs were mounted and Al wire-bonded on sockets and measured in a calibrated integrating sphere. No thermal management or light extraction fixtures were employed. As the driving current density increased from 0.1 to 50 A/cm$^2$, EL peak intensities increased monotonically and a blue-shift of the wavelength was observed, which is attributed to the band-filling and polarization screening effect due to increased carrier concentration within the QWs. The LED structure incorporating the Si NM exhibited improved EL intensities compared to the reference LED, especially for the high current injection range.

Figure 4B:
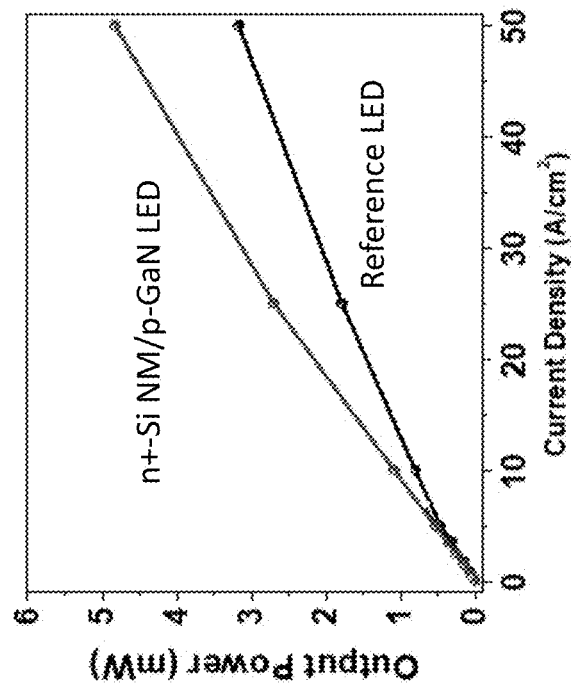
FIG. 4B shows the optical output power.
Figure 4A:
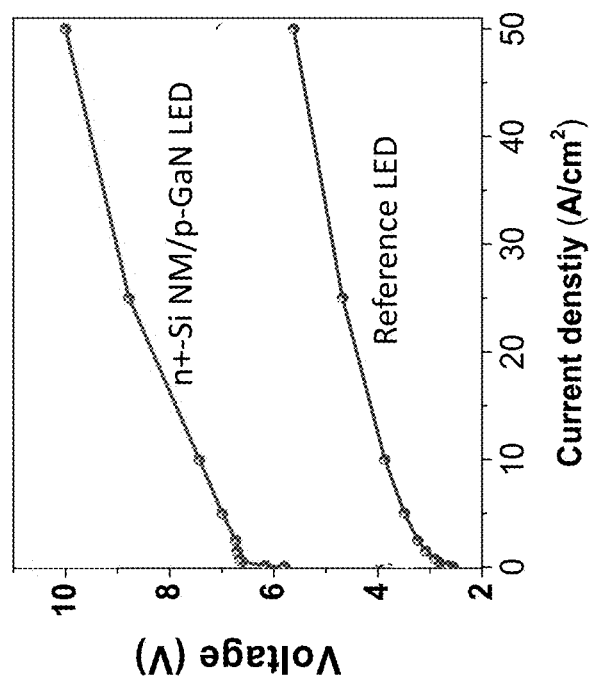
FIG. 4A shows the voltage versus current density for the reference LED and the LED having a Si/GaN heterojunction.
Figure 4C:
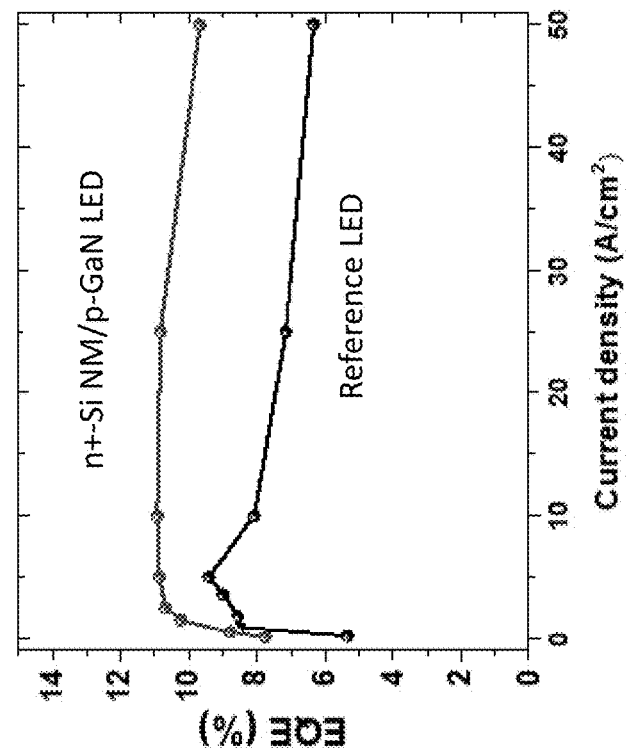
FIG. 4C depicts the external quantum efficiency (EQE). The measurements were made as a function of the current density ranging from 0.1 to 50 A/cm$^2$.

The electrical characteristics of the reference LED and the Si NM/GaN heterojunction LED were investigated. FIG. 4A plots the current-voltage characteristics of the two devices. The incorporation of the tunneling junction was found to have induced extra forward voltage for the same current injection compared to the reference LED. The optical output power and external quantum efficiency (EQE) were obtained as a function of current density, as presented in FIG. 4B and FIG. 4C, respectively. The enhancements in the optical power and EQE are direct proof of increased hole injection benefiting from the incorporation of the heavily doped Si NM, and the resultant increased hole injections into the active region. Additionally, the shift of the EQE peak intensity to the higher current density of the n-Si/p-GaN LEDs also indicates the improved balance between holes and electrons based on the ABC rate equation model, assuming that the total carrier generation rate is the sum of the non-radiative recombination (Shockley-read-hall) rate, radiative recombination rate and Auger non-radiative recombination rate, which are in linear, to the square and cubic relationship to the carrier densities, respectively. (See, e.g., Yang-SeokYoo, et al., Effective suppression of efficiency droop in GaN-based light-emitting diodes: role of significant reduction of carrier density and built-in field, Sci. Rep. 6, 34586; doi: 10.1038/srep34586 (2016).)

Figure 5A:
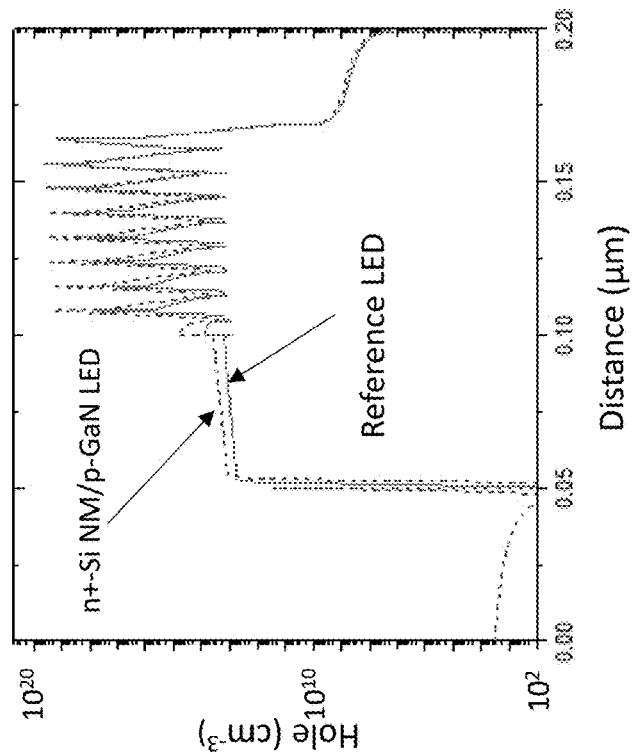
FIG. 5A shows electrical simulations of the hole concentration across the LED structures for a reference LED and an LED having an n$^+$-Si NM/p-GaN junction.
Figure 5C:
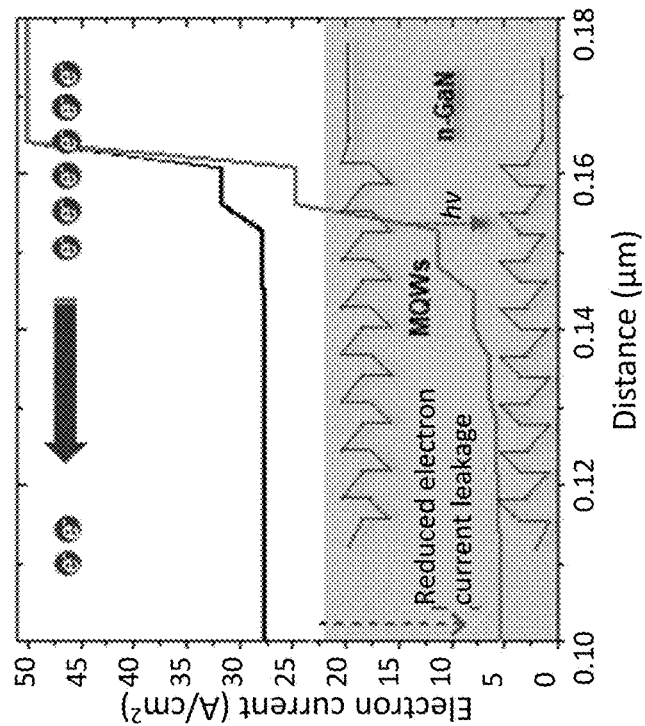
FIG. 5C is a graph showing the electron current leakage for the reference LED and the LED having an n$^+$-Si NM/p-GaN junction.
Figure 5B:
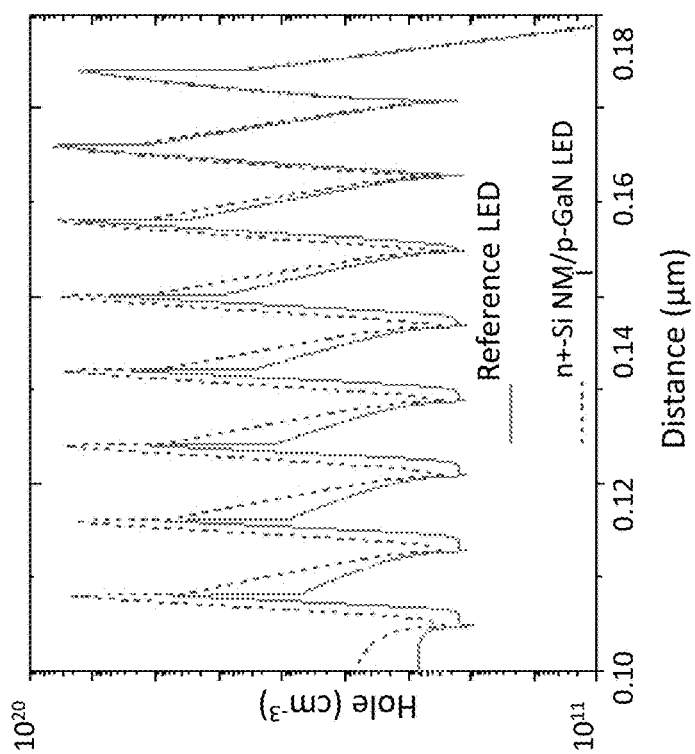
FIG. 5B shows an enlarged view of the hole concentration within the QWs.

To better understand the physics mechanisms for the hole injection enhancement induced by the incorporation of the n-Si NM/p-GaN tunneling heterojunction, numerical simulations were performed by Silvaco. In the simulations, the free hole concentration of the n-Si NM layer was set to be $8.8 \times 10^{19}$ cm$^{-3}$, and that of the p-GaN layer was $5 \times 10^{18}$ cm$^{-3}$ (assuming 10% carrier activation ratio for p-GaN). The polarization scale adopted was 0.4, due to the screening effect from material defects and carriers. (See, e.g., Modeling of polarization effects on n-GaN/i-InGaN/p-Gan solar cells with ultrathin GaN interlayers, Optical and Quantum Electronics 45(7) July 2013.) The effective masses of the holes and electrons in the Si were set as 0.12 me and 0.21 me, respectively, and those of the GaN were set as 0.8 me and 0.2 me, respectively. These are important parameters in calculating the tunneling rate. The tunneling probabilities were greatly influenced by the band structure near the junction, primarily the width and height of the energy barriers, which are related to the strength of the electric field at that region. Both the external field induced by external bias and the internal field mainly induced by the polarization contributed to the electric field strength. The results are shown in FIGS. 5A and 5B. Compared with the reference LED, the hole concentration in the quantum wells became higher for the LED with the tunneling heterojunction. These results show that the hole-injection efficiency became higher with the incorporation of the tunneling junction structure. The same conclusion can also be drawn from FIG. 5C, where the electron current leakage is shown to be lower for the LEDs with the n+-Si/GaN junction than for the reference LED.

Example 2

This example illustrates the use of a heterogeneous interband tunneling junction, n$^+$-Si/p-GaN, as a hole injector for a deep UV LED.

Experiments and Results

Figure 6B:
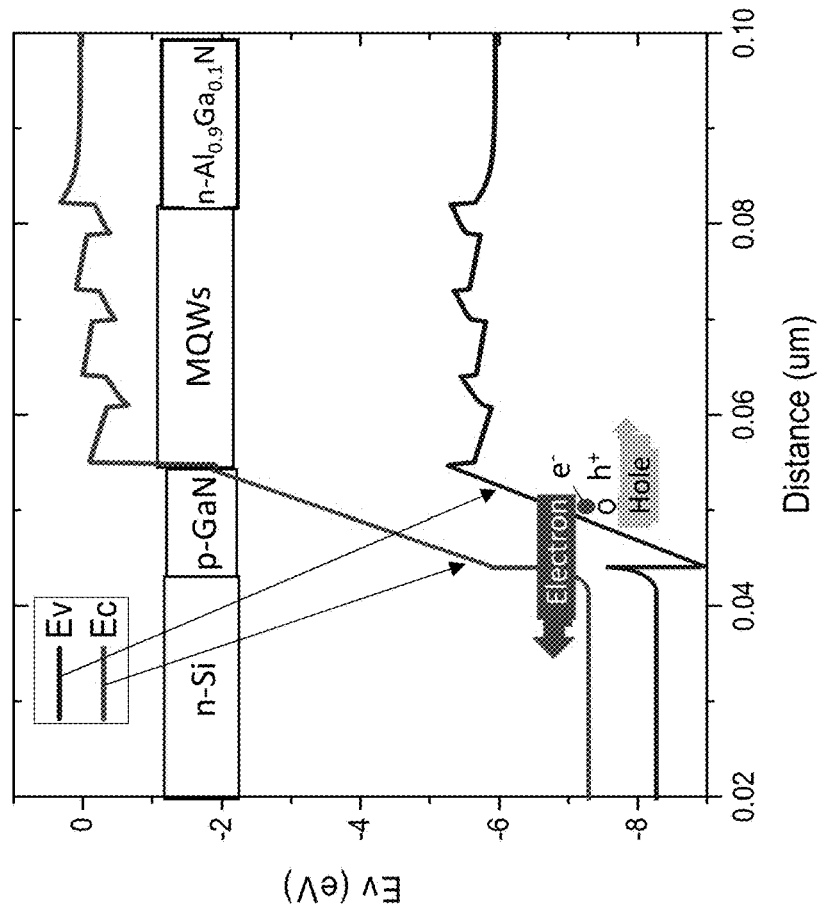
FIG. 6B shows the associated band alignments of the LED structure under forward bias (100 mA/cm$^2$).
Figure 6A:
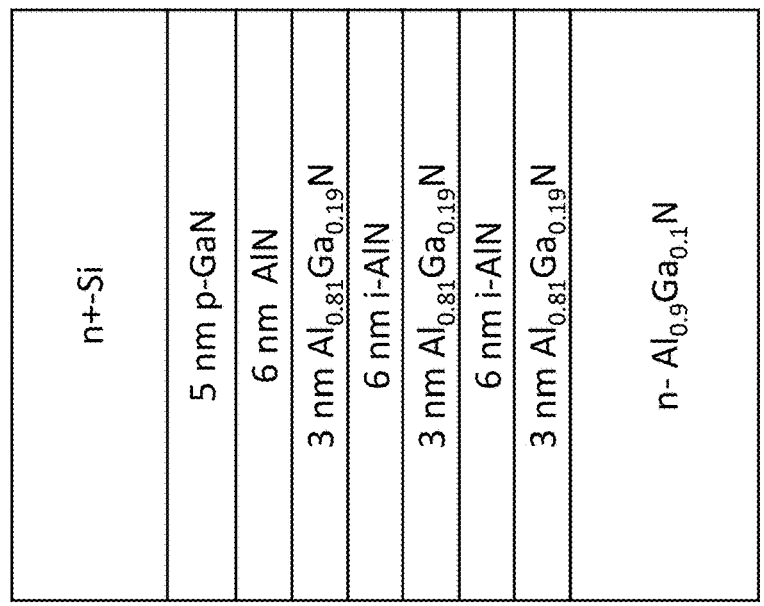
FIG. 6A is a schematics diagram showing a cross-sectional view of an LED that includes an n$^+$-Si/p-GaN junction.

FIG. 6A is a schematics diagram showing a cross-sectional view of an LED that includes an n$^+$-Si/p-GaN junction. The UV LED structure was grown on a bulk AlN substrate (not shown) by low pressure organometallic vapor phase epitaxy (LP-OMVPE). Following the growth of an initial 400 nm AlN homoepitaxial buffer layer (not shown) on the AlN substrate, a Si-doped (concentration: $1 \times 10^{19}$ cm$^{-3}$) 600 nm-thick n-Al$_{0.9}$Ga$_{0.1}$N n-type contact and electron injection layer was grown, prior to growing a 3-period 3 nm/6 nm Al$_{0.81}$Ga$_{0.19}$N/AlN MQW active region. The epitaxial growth was terminated with a 5 nm Mg doped ($\sim 4 \times 10^{19}$ cm$^{-3}$) p-GaN p-type layer to prevent rapid oxidation of the AlN surface. Prior to transferring a 100 nm thick, heavily doped single-crystal n-type Si nanomembrane (n-Si NM) onto the epi-structure, a 0.5 nm-thick Al$_2$O$_3$ layer, which acted as a quantum tunnel layer and a passivation layer, was deposited by five cycles of an atomic layer deposition (ALD) process using an Ultratech/Cambridge Nanotech Savannah S200 ALD system.

The associated band alignments of the LED structure under forward bias (100 mA/cm$^2$) are illustrated in the FIG. 6B. In the LE with an n+-Si/p-GaN heterojunction, interband tunneling hole injection occurred at the interface. FIG. 6B shows that the valence band of the p-GaN layer bent to be aligned with the conduction band of the n$^+$-Si layer. A quasi-triangular shaped depletion region was found, which was dependent on the doping concentration of the p-GaN layer (if doping concentration of Si>>GaN) and the applied bias. Thus, direct tunneling occurred, with the electrons in the valence band of the p-GaN tunneling into the conduction band of the n$^+$-Si through the band energy gap. Because a large number of electrons left the p-GaN, holes, which are electron vacancies, were generated in abundance within the p-GaN region and were eventually injected into the MQW active region.

Figure 7B:
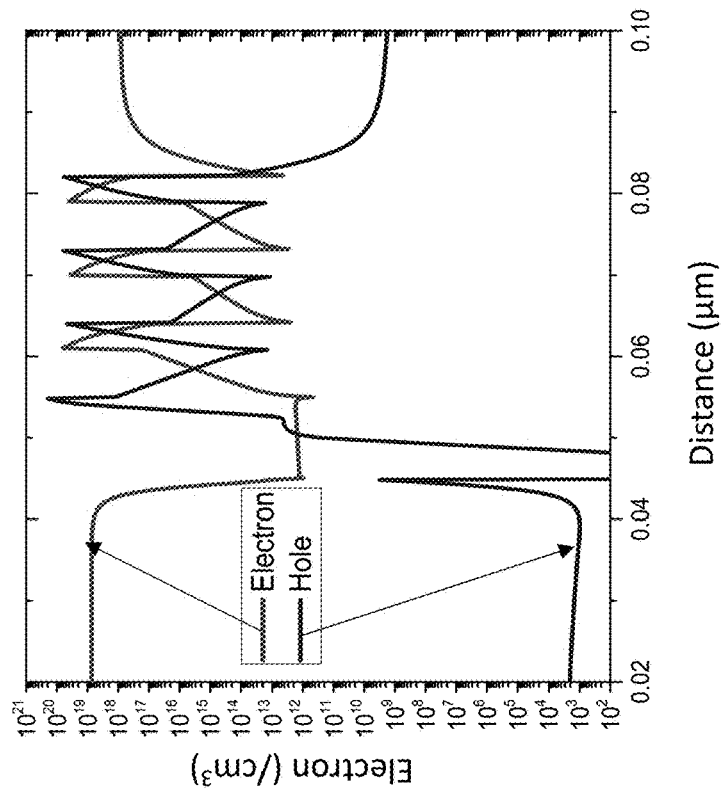
FIG. 7B is a plot of the carrier distributions within the UV LED structure under a current injection of 100 mA/cm$^2$.
Figure 7A:
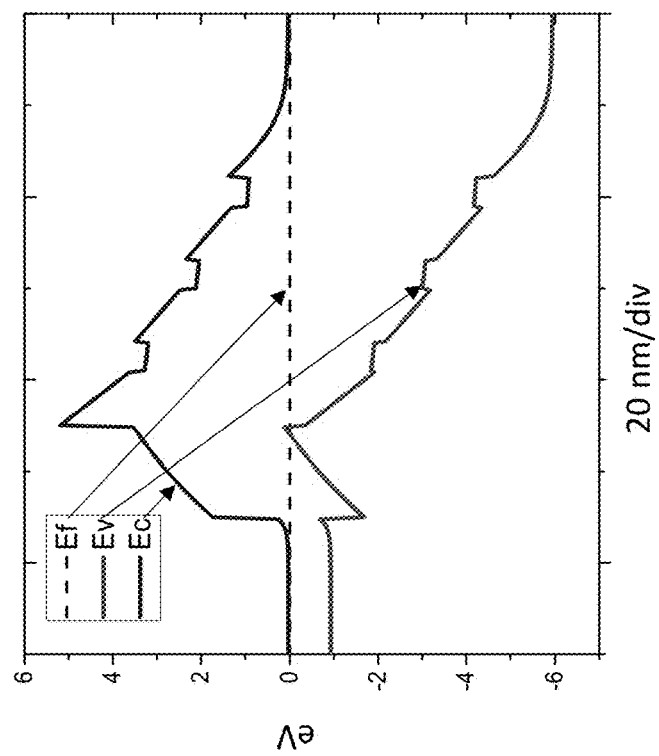
FIG. 7A shows the band alignments under thermal equilibrium across a n-Si/p-GaN/MQWs/n-AlGaN structure, with fermi-levels shown.

As in Example 1, numerical simulations were performed by Silvaco. In the simulations, the free hole concentration of the n-Si layer was set to be $8.8 \times 10^{19}$ cm$^{-3}$; that of the p-GaN layer was set at $5 \times 10^{18}$ cm$^{-3}$ (assuming a 10% carrier activation ratio for the p-GaN); and the polarization scale adopted was 0.4, due to the screening effect from material defects and carriers. The band alignments under thermal equilibrium of the UV LEDs across the n-Si/p-GaN/MQWs/n-AlGaN structure, with fermi-levels, are depicted in FIG. 7A, which shows that the Fermi levels of the two sides of the junction were both aligned. FIG. 7B is a plot of the carrier distributions within the UV LED structure under a current injection of 100 mA/cm$^2$. In spite of the scarcity of holes within the n-Si region, the holes accumulated exponentially inside p-GaN towards the QWs region and reached $2.5 \times 10^{20}$ cm$^{-3}$ at the p-GaN adjacent to the QWs. This confirms the effective hole injection through interband tunneling between the n-Si and p-GaN layer. These results prove that the hole-injection efficiency becomes higher with the incorporation of the tunneling junction structure compared with conventional structures, which typically suffer from imbalance of carriers due to hole insufficiency.

Figure 8:
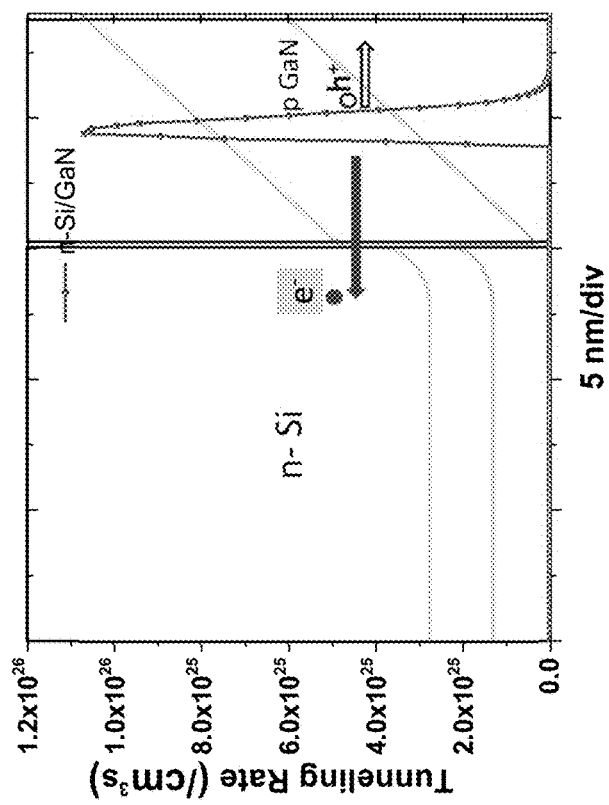
FIG. 8 shows the tunneling rates for in an n-Si/p-GaN heterojunction along the distance across the junction.

To investigate the hole injection efficiency for the tunneling junction, the tunneling probabilities under a current injection of 100 mA/cm$^2$ were extracted and compared. In the simulation, both the interband and intra-band tunneling models were considered. The effective masses of holes and electrons in the Si were set as 0.12 me and 0.21 me, respectively, and those of the GaN were set as 0.8 me and 0.2 me, respectively. These are important parameters in calculating the tunneling rate. As the band structure varies with the space around the junction and given that tunneling can take place at different energy levels, the non-local model was adopted to take into consideration all the tunneling possibilities. Tunneling rates for the n-Si/p-GaN heterojunction along the distance across the junction are shown in FIG. 8. The tunneling initiated from the valence band p-GaN layer, with electrons tunneling through the forbidding gap region to n-Si for the n-Si/p-GaN junction, as shown in FIG. 8. The tunneling existed in the location 3-6 nm away from the junction interface. The tunneling distribution was attributed to two factors: 1) for the GaN region close to the interface, there were no energy states on the Si side to allow the elastic tunneling process to occur, as the corresponding energy level lay within the band gap; and 2) for the GaN region farther away from the interface (>6 nm), the tunneling rate was negligible, as the tunneling rate decreased exponentially with the tunneling distance.

Figure 9A:
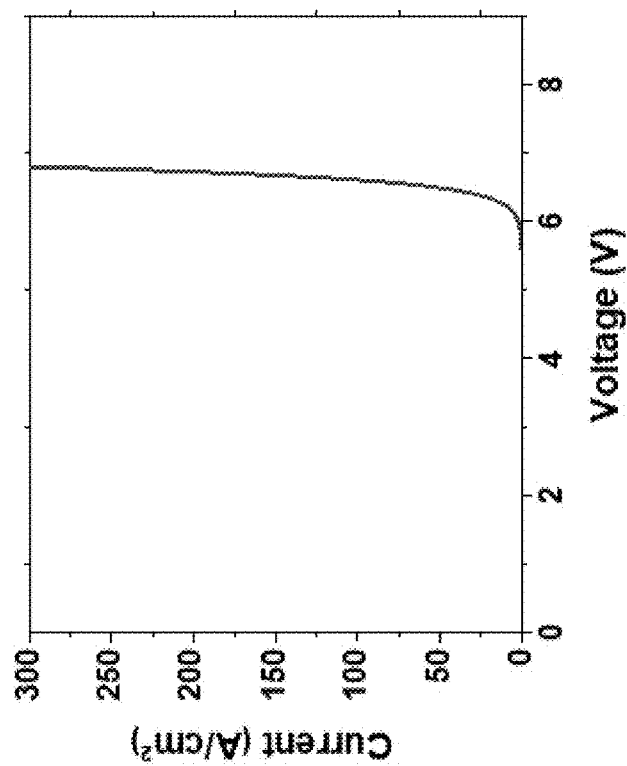
FIG. 9A plots the simulated current-voltage characteristics of an LED device.

The electrical characteristics of the UV LEDs with an n+Si/GaN tunneling heterojunction for hole injection were investigated. FIG. 9A plots the simulated current-voltage characteristics of the device. FIG. 9B shows the measured current-voltage curve in linear scale, which agreed with the simulated results. With linear fitting noted with a dotted line, the turn-on voltage for the UV LED with the n+Si/p-GaN junction was 13 V. The higher turn-on voltage compared to the simulation originated from the n-AlGaN contact induced resistance, which were not taken into consideration in the simulation model.

Figure 9C:
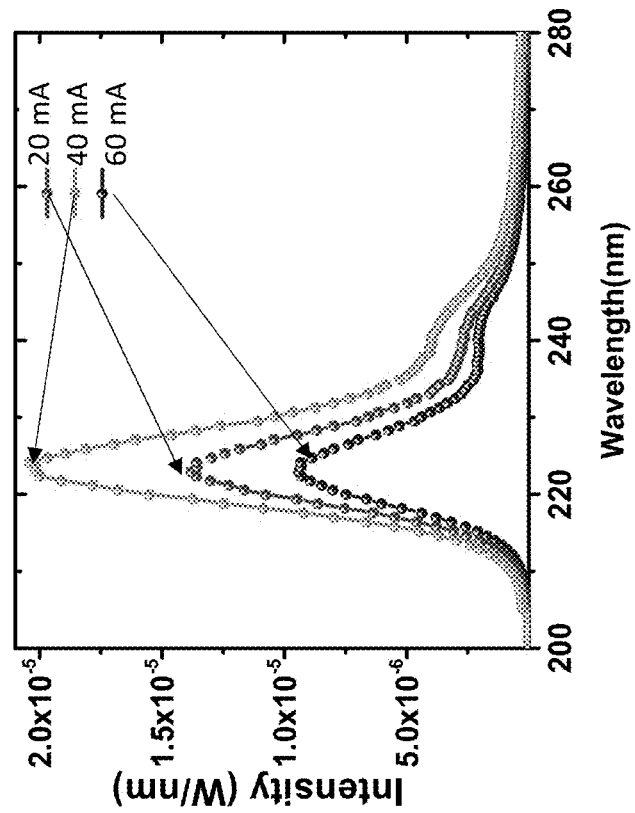
FIG. 9C shows the EL spectra measured for LED devices having n+Si/p-GaN junctions.
Figure 9B:
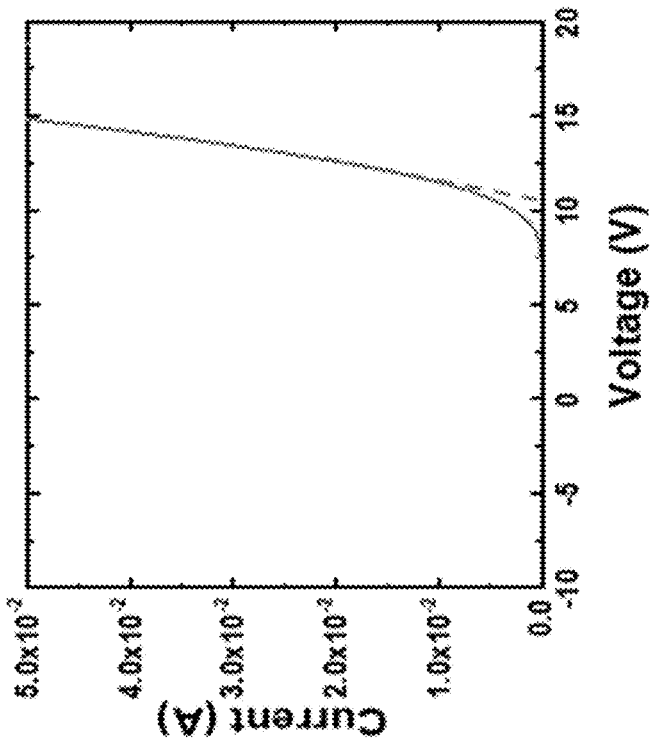
FIG. 9B shows the measured current-voltage curve for the device.

The electroluminescence (EL) spectra measured for the LED devices with the n+Si/p-GaN junction are compared in FIG. 9C. To carry out optical measurements, the LEDs were mounted, Al wire-bonded on sockets, and measured in a calibrated integrating sphere. No thermal management or light extraction fixtures were employed. The light emission peak was located at 226 nm under current injection of 20 mA. As driving current density increased from 20 to 60 A/cm$^2$, a blue-shift of the wavelength was observed, which was attributed to the band-filling and polarization screening effect due to increased carrier concentration within the QWs.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A light-emitting device comprising:
    a heterojunction comprising:
        a hole injection layer comprising a single-crystalline or polycrystalline n-type doped semiconductor material, wherein the single-crystalline or polycrystalline n-type doped semiconductor material is not a group III-nitride semiconductor material; and
        a p-type layer comprising a p-type doped group III-nitride;
    an n-type contact; and
    an active region comprising intrinsic semiconductor materials disposed between the p-type layer and the n-type contact, the active region comprising a multiple quantum well structure comprising alternating group III-V nitride barrier layers and group III-V nitride quantum well layers.

2. The device of claim 1, further comprising a quantum tunnel layer disposed between the hole injection layer and the p-type layer, the quantum tunnel layer comprising an inorganic material having a bandgap that is wider than the bandgaps of the n-type doped semiconductor material and the p-type doped group III-nitride, wherein the interface between the quantum tunnel layer and the hole injection layer and the interface between the quantum tunnel layer and the p-type layer do not have an epitaxial structure.

3. The device of claim 2, wherein the inorganic material is an oxide that is not a native oxide of the n-type doped semiconductor material or a native oxide of the p-type group III-nitride.

4. The device of claim 3, wherein the inorganic material is aluminum oxide or hafnium oxide.

5. The device of claim 1, wherein the p-type doped group III-nitride is p-type GaN.

6. The device of claim 5, wherein the n-type doped semiconductor material comprises an n-type doped group IV semiconductor.

7. The device of claim 6, wherein the n-type doped group IV semiconductor is n-type doped silicon.

8. The device of claim 7, further comprising a quantum tunnel layer disposed between the hole injection layer and the p-type layer, the quantum tunnel layer comprising an inorganic material having a bandgap that is wider than the bandgaps of the n-type doped silicon and the p-type GaN, wherein the interface between the quantum tunnel layer and the hole injection layer and the interface between the quantum tunnel layer and the p-type layer do not have an epitaxial structure.

9. The device of claim 8, wherein the inorganic material is aluminum oxide.

10. The device of claim 8, wherein the inorganic material is hafnium oxide.

11. The device of claim 1, wherein the n-type doped semiconductor material comprises an n-type doped group IV semiconductor.

12. The device of claim 11, wherein the n-type doped group IV semiconductor is n-type silicon.

13. The device of claim 12, wherein the n-type silicon is single-crystalline silicon.

14. The device of claim 12, wherein the n-type silicon is polycrystalline silicon.

15. The device of claim 12, wherein the group III-V nitride barrier layers comprise AlN and the group III-V nitride quantum well layers comprise AlGaN.

16. The device of claim 12, wherein the group III-V nitride barrier layers comprise GaN and the group III-V nitride quantum well layers comprise InGaN.

17. The device of claim 11, wherein the n-type doped group IV semiconductor is n-type germanium.

* * * * *

UNITED STATES PATENT AND TRADEMARK OFFICE
CERTIFICATE OF CORRECTION

PATENT NO. : 10,297,714 B1
APPLICATION NO. : 15/945947
DATED : May 21, 2019
INVENTOR(S) : Zhenqiang Ma et al.

It is certified that error appears in the above-identified patent and that said Letters Patent is hereby corrected as shown below:

In the Specification

Column 7, Line 29:
Delete the phrase "Sift is a native oxide of Si.)" and replace with --$SiO_2$ is a native oxide of Si.)--.

Column 9, Line 64:
Delete the phrase "(500 (Si/buried oxide (box) = 205 nm/400 nm)" and replace with --(SOI) (Si/buried oxide (box) = 205 nm/400 nm)--.

Signed and Sealed this
First Day of October, 2019

Andrei Iancu
*Director of the United States Patent and Trademark Office*